United States Patent [19]

Sudoh et al.

[11] Patent Number: 5,499,316

[45] Date of Patent: Mar. 12, 1996

[54] RECORDING AND REPRODUCING SYSTEM FOR SELECTIVELY REPRODUCING PORTIONS OF RECORDED SOUND USING AN INDEX

[75] Inventors: Kengo Sudoh; Kousou Hayashi, both of Higashihiroshima; Yuji Sumitomo, Yamatokoriyama, all of Japan

[73] Assignee: Sharp Kabushiki Kaisha, Japan

[21] Appl. No.: 903,263

[22] Filed: Jun. 24, 1992

[30] Foreign Application Priority Data

Jul. 19, 1991 [JP] Japan .................................. 3-179827

[51] Int. Cl.⁶ .................................................. G10L 9/00
[52] U.S. Cl. ............................................ 395/2.79; 395/2.87
[58] Field of Search ............................ 381/29–53; 395/2, 395/2.79, 2.87, 2.85; 365/238.5; 369/65, 66, 83; 379/68, 88, 89

[56] References Cited

U.S. PATENT DOCUMENTS 4,701,862  10/1987  Washizuka et al. .......................... 395/2
5,053,956  10/1991  Donald et al. ............................ 358/183
5,056,145  10/1991  Yamamoto et al. ........................ 381/51

FOREIGN PATENT DOCUMENTS

0372514A2  6/1990  European Pat. Off. .
0421769A2  4/1991  European Pat. Off. .
63-259899  10/1988  Japan .
63-271500  11/1988  Japan .
WO91/11811  1/1991  WIPO .

*Primary Examiner*—Allen R. MacDonald
*Assistant Examiner*—Michelle Doerrler
*Attorney, Agent, or Firm*—Nixon & Vanderhye

[57] ABSTRACT

A recording and reproducing apparatus for recording and reproducing sound using a semiconductor memory as a recording medium, the apparatus including index recording means for storing an index having retrieval information for retrieving an arbitrary position of recorded sound and positional information for indicating a memory address to be retrieved by the retrieval information; and retrieving and reproducing means for retrieving the index containing a specified retrieval information to reproduce the sound from the memory address indicated by the positional information of the index.

13 Claims, 13 Drawing Sheets

RECORDING AND REPRODUCING SYSTEM FOR SELECTIVELY REPRODUCING PORTIONS OF RECORDED SOUND USING AN INDEX

FIELD OF THE INVENTION

The present invention relates to a recording and reproducing apparatus and more particularly, to a recording and reproducing apparatus including a computer configuration to record and reproduce sound or voice, using a semiconductor memory as an external data storage.

DESCRIPTION OF THE RELATED ART conventionally, a cassette tape recorder or digital audio tape recorder (referred to as a DAT hereinafter) has been used as an apparatus for recording and reproducing sound or voice. Recently, a computer configuration has been introduced to store the sound data in a semiconductor memory. Since the semiconductor memory is preferably used in order to minimize the size of a product detachable IC memory cards have been increasingly more popular.

A conventional computer-aided recording and reproducing apparatus connected with an external memory will be now described as the related art. As shown in FIG. 10, a recording and reproducing apparatus comprises an apparatus body 21 such as a computer consisting of a CPU 22 for controlling the whole apparatus, a memory controller 23 and an address/data controller 24 connected to the CPU 22, a memory 25 controlled by the memory controller 23, and interfaces 27 to 31 (I/F in the figure) connected to the address/data controller 24. In addition, an external apparatus 32 such as a hard disc drive is connected to the apparatus body 21 through the interface 27 and a detachable IC memory card 33 is connected to the apparatus body 21 through the interface 28. In addition, manual input unit 34 is connected to the apparatus body 21 through the interface 29 and a microphone 37 for converting sound to sound data and inputting it to the apparatus body 21 and sound input unit 35 comprising an A/D converter 36 is connected also to the apparatus body 21 through the interface 30. In addition, a speaker 40 for converting the sound data from the body 21 into sound and outputting it and sound output unit 38 comprising a D/A converter 39 are connected to the body 21 through the interface 31.

The IC memory card 33 writes and reads data into or from the apparatus body 21 through the extended bus 26 which connects the address/data controller 24 with the interfaces 27 to 30, and the IC memory card 33 serves as a part of an extended memory. In the apparatus of the above structure, the CPU 22 records sound data input from the sound input means 35 into the IC memory card and reproduces sound data from the IC memory card in accordance with a procedure of a flowchart shown in FIG. 11.

First, when initialization including inputting of a file name given to the sound to be recorded is performed through a key input at step S51, address of the IC memory card 33 is updated to address where sound data is to be recorded next before recording at step S52. Then, the sound data input by the sound input means is recorded at the updated address in the IC memory card 33 through the interface 28 at step S53.

While recording, it is determined whether recording is terminated by an input of a stop key at step S54. The recording is either terminated or processing after step S52 is repeated until the recording is terminated.

In a case where the recorded sound data is reproduced, when reproduction start is requested through the key input at step S61, a reproduction start address on the IC memory card 33 is read. Sound data stored at that address are read and then reproduced through a speaker 40 of sound output means 38 at step S63. The address on the IC memory card 33 is updated to an address of sound data to be reproduced next at step S64. Then it is determined whether reproduction termination is requested through a key input at step S65. Then, the reproduction is terminated or processing after step S63 is repeated until the reproduction is terminated.

Besides the above configuration, Japanese Unexamined Patent Publications Nos. 259700/1988, 259899/1988, 271500/1988 and 282797/1988 have disclosed recording and reproducing apparatus using semiconductor memory devices.

Since a cassette tape recorder does not have a retrieval function, it can not reproduce only the sound in a desired section. In contrast, a DAT records an index for retrieving every section in accordance with an absolute position or the like and can reproduce the sound in a desired section by retrieving the index. However, it is necessary to fast forward or rewind a magnetic tape manually in order to retrieve the desired index which of course takes time. In structures using the computer and the IC memory card or the like shown in FIG. 10, sound can be recorded and reproduced, but it can not be retrieved when reproduction is intended.

In addition, the prior art does not have a function of sorting a sound in a specific section together with other sounds in other sections and selectively reproducing the sound in the specific section, or a function of rearranging the sound section-by-section and reproducing it. Therefore, when a number of music selections are recorded and the order of music is desired to be changed for reproduction, a cassette tape has to be fast forwarded or rewound to retrieve a desired music selection in turn. Music items are often dubbed on each other tape in the order retrieved when edited, which is troublesome and time-consuming work.

SUMMARY OF THE INVENTION

The present invention provides a recording and reproducing apparatus for recording and reproducing sound using a semiconductor memory as a recording medium, said apparatus comprising a recording and reproducing apparatus body having index recording means for storing an index having retrieval information for retrieving an arbitrary position of recorded sound and positional information for indicating a position or address to be retrieved by the retrieval information, and retrieving and reproducing means for retrieving the index containing a specified retrieval information to reproduce the sound from a position indicated by the positional information of the index; and a semiconductor memory having an index storage region in which the index is recorded and a sound storage region in which sound data is recorded.

In the above structure, the retrieving and reproducing means may be replaced with category specifying means, category selecting and reproducing means and sound sorting means. In addition, the category specifying means, the category selecting and reproducing means and the sound sorting means may be provided in the above recording and reproducing apparatus. The retrieving and reproducing means may be replaced with reproduction order specifying means and priority order reproducing means. In addition, the reproduction order specifying means and the priority order reproducing means may be provided in the above recording and reproducing apparatus. The category specifying means, the category selecting and reproducing means, the sound sorting means, the reproduction order specifying means and the priority order reproducing means may be provided in the recording and reproducing apparatus.

A semiconductor memory is detachably mounted to a recording and reproducing apparatus.

The category specifying means specifies a category indicating a characteristic of sound data in a section labeled or divided by positional information of the sound data contained in a first and second indexes in a semiconductor memory, using a sorting code recorded in the retrieval information in the index indicating a head address of the sound data in each section.

The category selecting and reproducing means retrieves an index containing the retrieval information for specifying a specified category in the semiconductor memory and reproduces the sound in a section starting from an address represented by the positional information contained in the first index which is read by retrieving to an address represented by the positional information in the second index positioned next to the first index and indicating the end of the section of the sound to be reproduced in the semiconductor memory.

The reproduction order specifying means specifies a reproduction order of the sound data in each section labeled or divided by the positional information of the sound data contained in the first and second indexes in the semiconductor memory, using the retrieval information of the index indicating the head address of the sound data in each section.

The priority order reproducing means retrieves the retrieval information of the index in the semiconductor memory the order of reproduction and reproduces the sound in a section starting from an address indicated by the positional information of the first index which is read every retrieval and ending at an address indicated by the positional information of the second index indicating the end of the section of the sound data to be reproduced.

The sound sorting means extracts a characteristic of the sound data input to the body and generates a sorting code indicating the characteristic of the voice.

A CPU (Central Processing Unit) generally is used to realize the index recording means, the retrieving and reproducing means, the category specifying means, the category selecting and reproducing means, reproduction order specifying means and the priority order reproducing means. In addition, the memory contains a main RAM (Random Access Memory), a ROM (Read Only Memory) for storing a BIOS (Basic Input Output System) or the like. When an application program by which the body records and reproduces sound is executed, the application program is loaded into the memory.

DESCRIPTION OF THE PREFERRED EMBODIMENTS

A recording and reproducing apparatus in accordance with the present invention will be described in reference to FIGS. 1 to 9 hereinafter.

Figure 1:
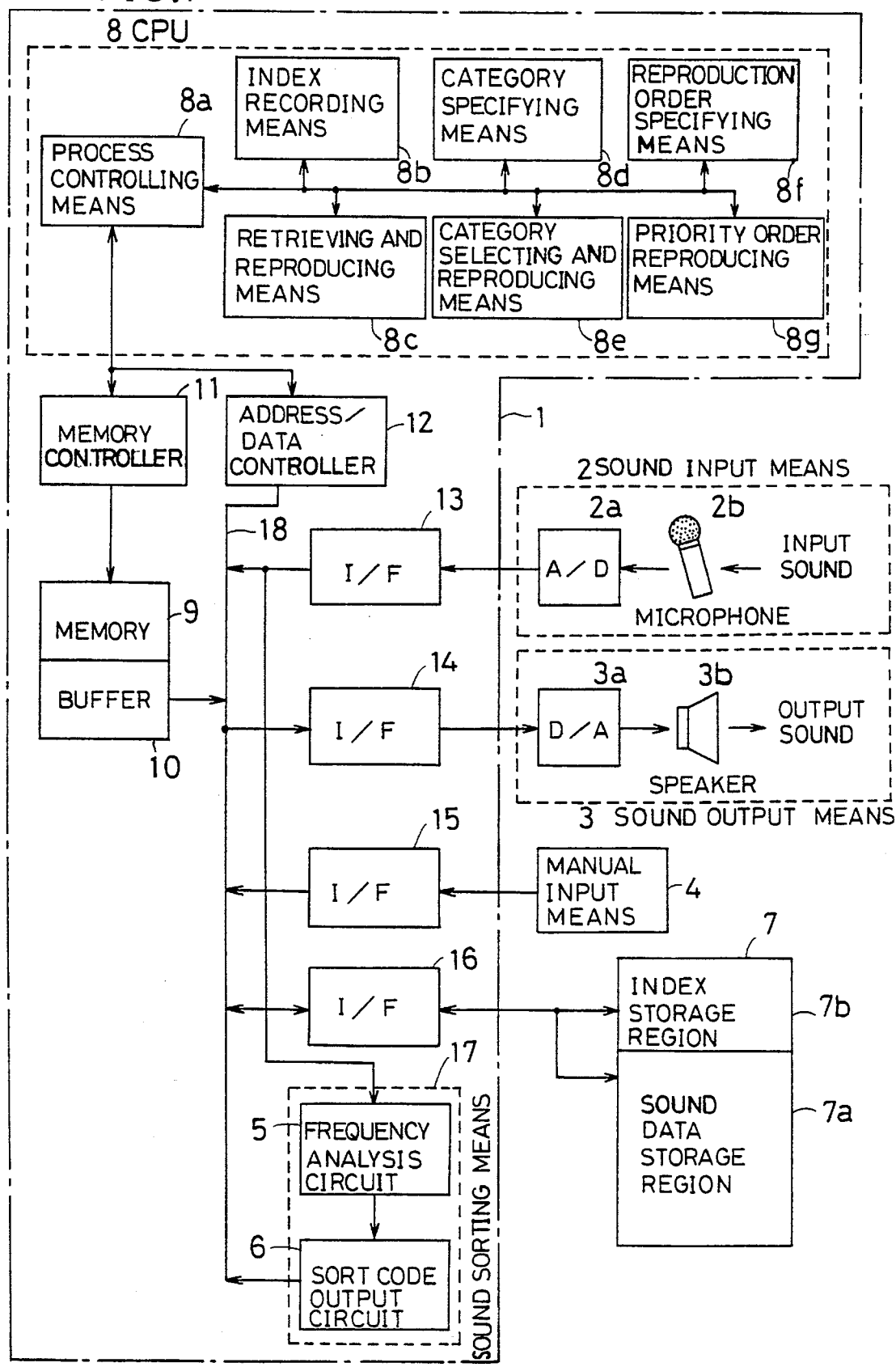
FIG. 1 is a block diagram showing a structure of a recording and reproducing apparatus in accordance with an embodiment of the present invention.

Referring to FIG. 1, a recording and reproducing apparatus includes a recording and reproducing apparatus body 1, a semiconductor memory 7 mounted to the body and capable of recording sound data, sound input means 2 for converting sound (acoustic analog signal) to sound digital data and inputting to the body, sound output means 3 for converting the sound digital data from the body to sound (acoustic analog signal) and outputting it, and manual input means 4 for indicating contents to be controlled to the body. The body 1 includes a buffer 10 for temporarily storing the sound data, an address/data controller 12 for transferring and controlling the sound data and indicating the contents to be controlled, a memory 9 for storing a program for controlling the body, a memory controller 11 for controlling operations of the memory and the buffer, process controlling means 8a for controlling recording and reproducing operations of the body and the semiconductor memory, an index recording unit 8b for recording an index consisting of retrieval information for retrieving a position of the sound data in the semiconductor memory and positional information indicating the position or address of the sound data to be retrieved into the semiconductor memory, and a retrieving and reproducing unit 8c for retrieving the index containing the specified retrieval information in the semiconductor memory, reading the sound data from the position indicated by the positional information contained in the index and reproducing it as the sound, and sound sorting means 17 for extracting a characteristic of the sound data input to the body and generating a sorting code indicating the characteristic of the sound; the category specifying unit 8d for specifying a category indicating a characteristic of sound data in a section labeled or divided by positional information of the sound data contained in first and second indexes in a semiconductor memory, using a sorting code recorded in retrieval information in the index indicating a head address of the sound data in each section, and the category selecting and reproducing unit 8e for retrieving the index containing the retrieval information for specifying the category specified by manual input means in the semiconductor memory and reproducing sound in a section from an address indicated by the positional information contained in the first index read by the retrieval to an address indicated by the positional information of the second index which is indicating the end of the section and is positioned next to the first index in the semiconductor memory, and the reproduction order specifying unit 8f for specifying a reproduction order of the sound data in a section divided by the positional information of the sound data contained in first and second indexes in the semiconductor memory, using retrieval information of the index indicating the head address of the sound data in each section; and the priority order reproducing unit 8g for retrieving the retrieval information of the index in the semiconductor memory in accordance with priority and reproducing sound in a section from an address indicated by the positional information of the first index read every retrieval to an address indicated by the positional information of the second index positioned next to the first index and indicating the end of the section of the sound data to be reproduced. The semiconductor memory 7 separately includes an index storage region 7b in which the index is recorded and a sound storage region 7a in which the sound data is recorded.

Referring to FIG. 1, reference numeral 1 designates a body of a recording and reproducing apparatus of the present invention, which comprises a computer configuration, that is, a CPU 8, a memory 9, a buffer 10, a memory controller 11, an address/data controller 12, interfaces 13 to 16 and sound sorting means 17. In addition, to the body 1 connected are sound input means 2, sound output means 3, manual input means 4 and an IC memory card 7 serving as a semiconductor memory which is detachably mounted to the body.

As shown in FIG. 1, the CPU 8 comprises or acts as a process controlling unit 8a, an index recording unit 8b, a retrieving and reproducing unit 8c, a category specifying unit 8d, a category selecting and reproducing unit 8e, a reproduction order specifying unit 8f, a priority order reproducing unit 8g and other functioning units. The CPU 8 performs several operations and also performs an application program for recording and reproducing the sound to control the memory controller 11 and the address/data controller 12, whereby the sound is recorded and reproduced into and from the IC memory card 7. The application program is generally stored in a recording medium of an external memory such as a floppy disc drive or the like and loaded in the memory 9 after a power is supplied and then executed by the CPU 8.

The memory 9 is a memory group consisting of a main RAM (Random Access Memory), a ROM (Read Only Memory) for storing a BIOS (Basic Input Output System) or the like. The buffer 10 temporarily stores sound data until it is transferred to the IC memory card 7, in which processing of the sound data is performed. The buffer 10 is connected to an extension bus 18 connected to the address/data controller 12.

The memory controller 11 is a circuit for controlling operations 9 and the buffer 10 by a command of the CPU 8 in accordance with the application program. The address/data controller 12 controls transfer of data on the extension bus 18, to the IC memory card 7 or the like.

The process controlling unit 8a of the CPU 8 controls operations of the memory controller 11, the address/data controller 12, the index recording means 8b, the retrieving and reproducing means 8c, the category specifying means 8d, the category selecting and reproducing means 8e, the reproduction order specifying means 8f, the priority order reproducing means 8g and the sound sorting means 17.

The interfaces 13 to 16 are connected to the extension bus 18. The interface 13 is connected to an A/D converter 2a and converts the sound data output from the A/D converter 2a to 1-bite data for example. The interface 14 is a circuit for converting data transferred from the IC memory card 7 through the buffer 10 to the sound data so as to be able to be processed by a D/A converter 3a. The interface 15 is a circuit for converting an input signal input from the manual input means 4 to data so as to be able to be processed in the apparatus body 1. The interface 16 is a circuit for accessing the IC memory card 7 from the apparatus body 1, which interface changes an address of the IC memory card 7 when capacity of the IC card memory is too large to be accessed by the apparatus body 1 at one time.

The sound sorting unit 17 extracts a characteristic of the sound data input to the apparatus body and generates a sorting code representing a characteristic of the sound which includes a frequency analysis circuit 5 and a sorting code output circuit 6.

The frequency analysis circuit 5 sorts the sound data output from the A/D converter 2a through the interface 13 in accordance with distribution of a sound spectrum. The frequency analysis circuit 5 measures a frequency of sound until a sample number of a constant reference when a level of the sound is a predetermined reference value or more, determines which part in a frequency range its measured result belongs to as shown in FIG. 2, counts the determined number of times at every frequency range, sorts the sound data in the frequency range where the average value of the count number belongs to and generates the sound sorting code in accordance with the sorting.

Figure 2:
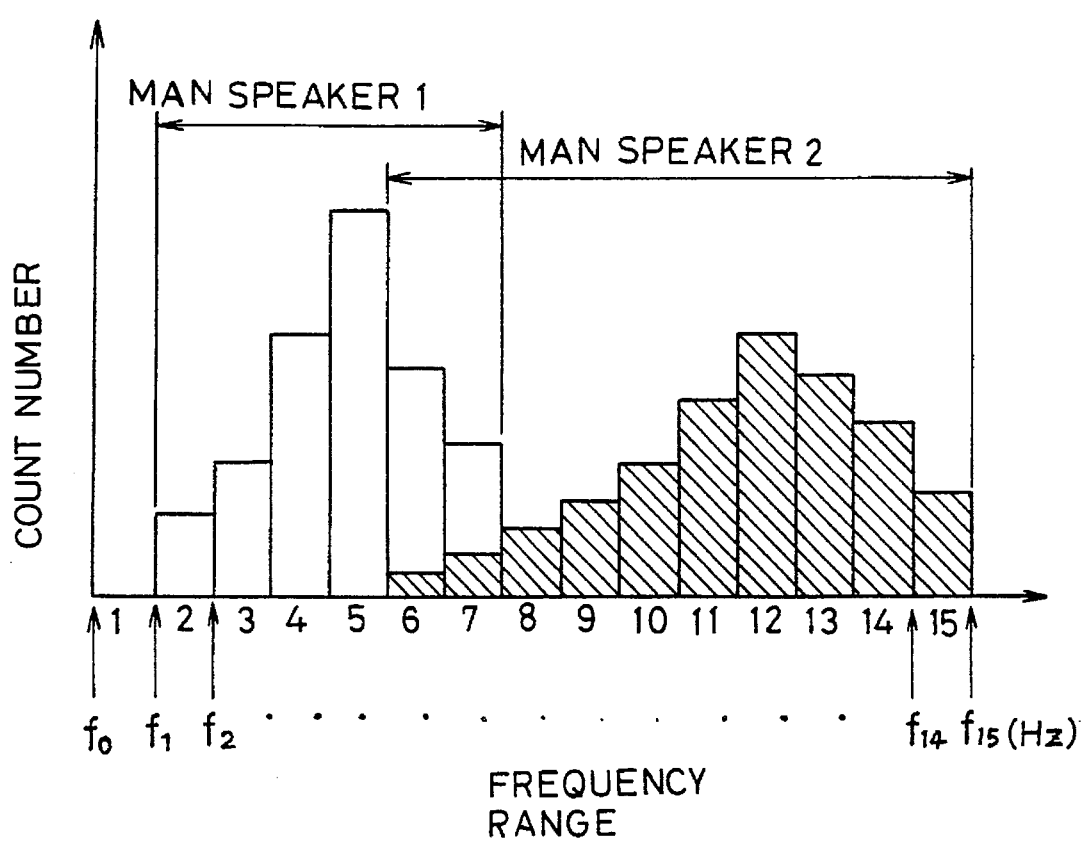
FIG. 2 is a graph showing an operation of a frequency analysis circuit in the recording and reproducing apparatus shown in FIG. 1.

As shown in FIG. 2, $f_0$Hz to $f_1$Hz is set at a range 1 and $f_1$Hz to $f_2$Hz is set at a range 2. When the above processing is performed, distribution of the count number of sound data of a man speaker 1 and sound data of a man speaker 2 is examined. Then, when the average value of the count number is made the sound sorting code, two sound data are determined to be from different sources and thereby it is possible to sort the man speakers.

The sorting code output circuit 6 converts an analyzed result output by the frequency analysis circuit 5 into 1-byte code. The code is transferred to the apparatus body 1 through the extension bus 18.

Figure 3:
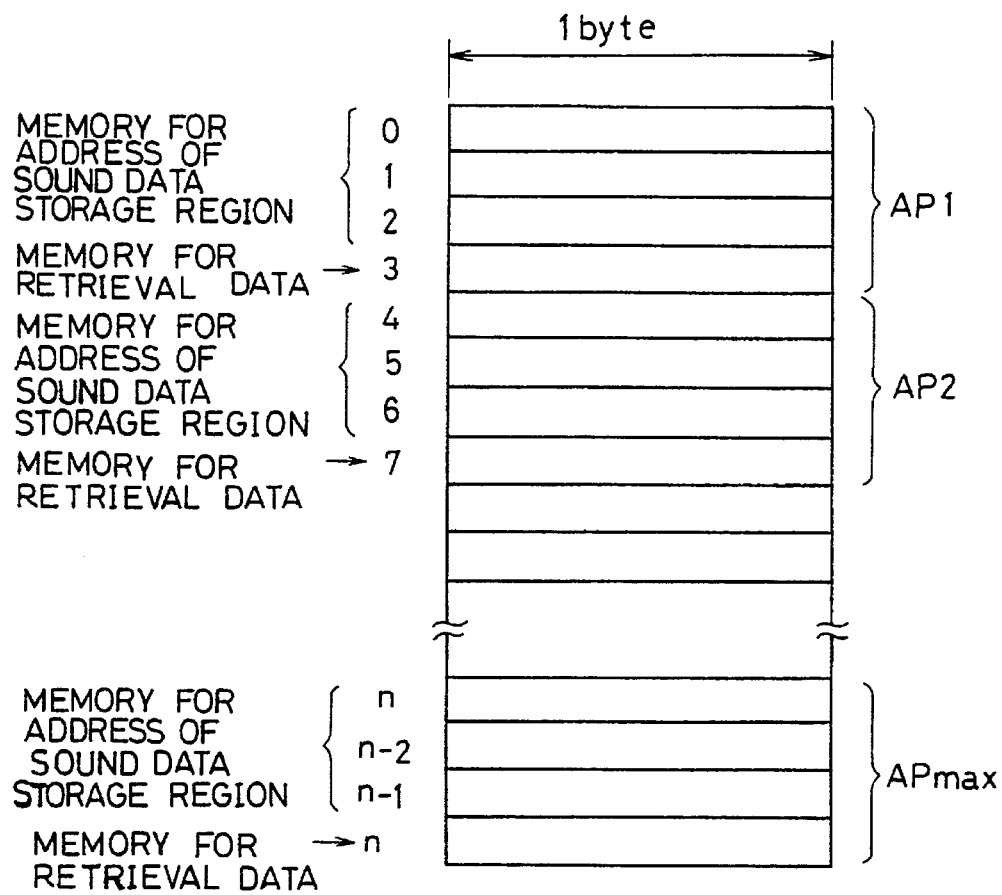
FIG. 3 is a view showing arrangement of addresses in an index storage region in an IC memory card.

The IC memory card 7 serving as the semiconductor memory has a sound data storage region 7a serving as a sound recording part and an index storage region 7b serving as an index recording part. The index storage region 7b consists of a plurality of address pointers $AP_1$ to $AP_{max}$ as shown in FIG. 3 (Note: FIG. 3 does not refer to 7a). Referring to each of the address pointers $AP_1$ to $AP_{max}$, one unit address of the sound data storage region 7a which forms the positional information is allotted to the first to third addresses and retrieval data which forms the retrieval information found at the above address is allotted to the fourth address.

More specifically, in the address pointer $AP_1$ of the index region 7b, one unit address which is the same as in the sound data storage region 7a is stored in 3-byte region consisting of address 0 to address 2. Thus, each of the address pointers $AP_1$ to $AP_{max}$ of the index storage region 7b stores one index in the form of a combination of address and retrieval data.

In addition, the IC memory card 7 may store the application program. In this case, a ROM for storing the application program is provided.

The sound input means 2 comprises a microphone 2b and the A/D converter 2a. The A/D converter 2a converts the sound input from the microphone to the body 1, in other words, from analog signal to a digital signal and then inputs it as sound data to the body 1.

The sound output means 3 comprises a D/A converter 3a and a speaker 3b. The D/A converter converts sound data output from the body 1, that is, from a digital signal to an analog signal.

The manual input means 4 is a manual device for inputting a command such as recording and reproducing of the sound data or specifying a position or address to be retrieved. For example, a key board may be used for that means.

Next, a kind of retrieval data loading to form the retrieval information contained in the index and the way of setting such will be described.

The retrieval data is a generic term for a document mark DM, a search mark SM, a sorting mark CM, a priority mark PM or the like.

The document mark DM is generally automatically recorded when the sound recording is started or terminated in accordance with determination of the application program, which is used for finding out the head of each section. The document mark DM can be recorded at any position by a key input. The search mark SM is recorded when the sound is recorded or reproduced at a desired position of the sound. The sorting mark CM shows a category in each section divided by the index containing the sorting mark CM, which corresponds to the sound sorting code provided in the frequency analysis circuit 5. In addition, the sorting mark CM can be set by the key input. The priority mark PM gives a reproduction order for reproducing sound in each section divided by the index containing the priority mark PM. The priority mark PM is automatically recorded by a command of the application program or recorded through the key input.

Figure 4:
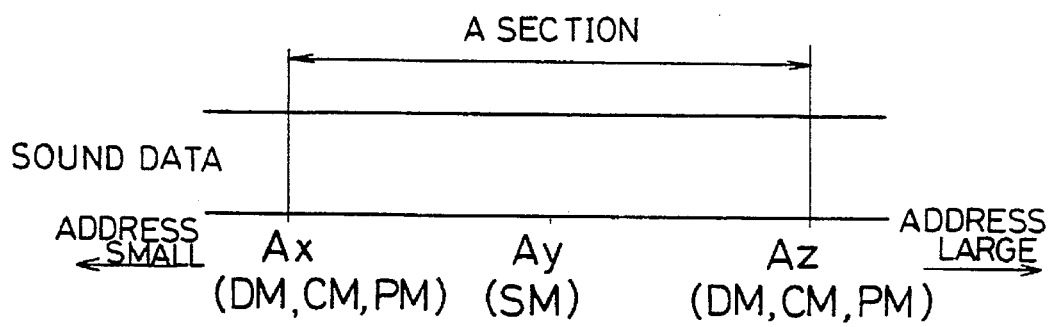
FIG. 4 is a view showing an index recorded at an arbitrary position of sound data.

As shown in FIG. 4, the document mark DM, the sorting mark CM and the priority mark PM correspond to addresses $A_x$ and $A_z$ which determines one section of the sound data. In addition, the search mark SM corresponds to an arbitrary address $A_y$ between the addresses $A_x$ and $A_z$.

The CPU 8 provides the following functions by executing the application program in accordance with a command input from the key board 3. The CPU 8 has a function of index recording for recording an index in the IC memory card 7 automatically in accordance with the application program or through a key input of the key board 4.

In addition, the CPU 8 has a function of retrieving and reproducing means for retrieving the index containing the document mark DM or the search mark SM specified at the time of reproduction and reproducing the sound data from the address of the index.

In addition, the CPU 8 has a function of category specifying for specifying the category of sound in a section divided by the index when retrieved, using a sorting mark of the index positioned at the head of each section, by recording the sorting mark in the IC card memory. In addition to the above function, the CPU 8 has category selecting and reproducing for detecting the index of the sorting mark CM corresponding to the category specified by searching the index when the category is specified at the time of reproduction, and reading and reproducing the sound data in a section from the address of the index to the address of the index containing the next sorting mark CM from the IC memory card 7.

In addition, the CPU 8 has reproduction order specifying for specifying the reproduction order of the sound of each section divided by the indexes, using retrieval data of the index positioned at the head of the section, while the priority mark PM is recorded as a priority number. In addition to the above function, the CPU 8 has a function of priority order reproducing for detecting the index of the priority mark in order to reproduce the sound data on priority basis, and reading and reproducing the sound data in a section from the address of the index to the address of the index containing the next priority mark PM.

Figure 5:
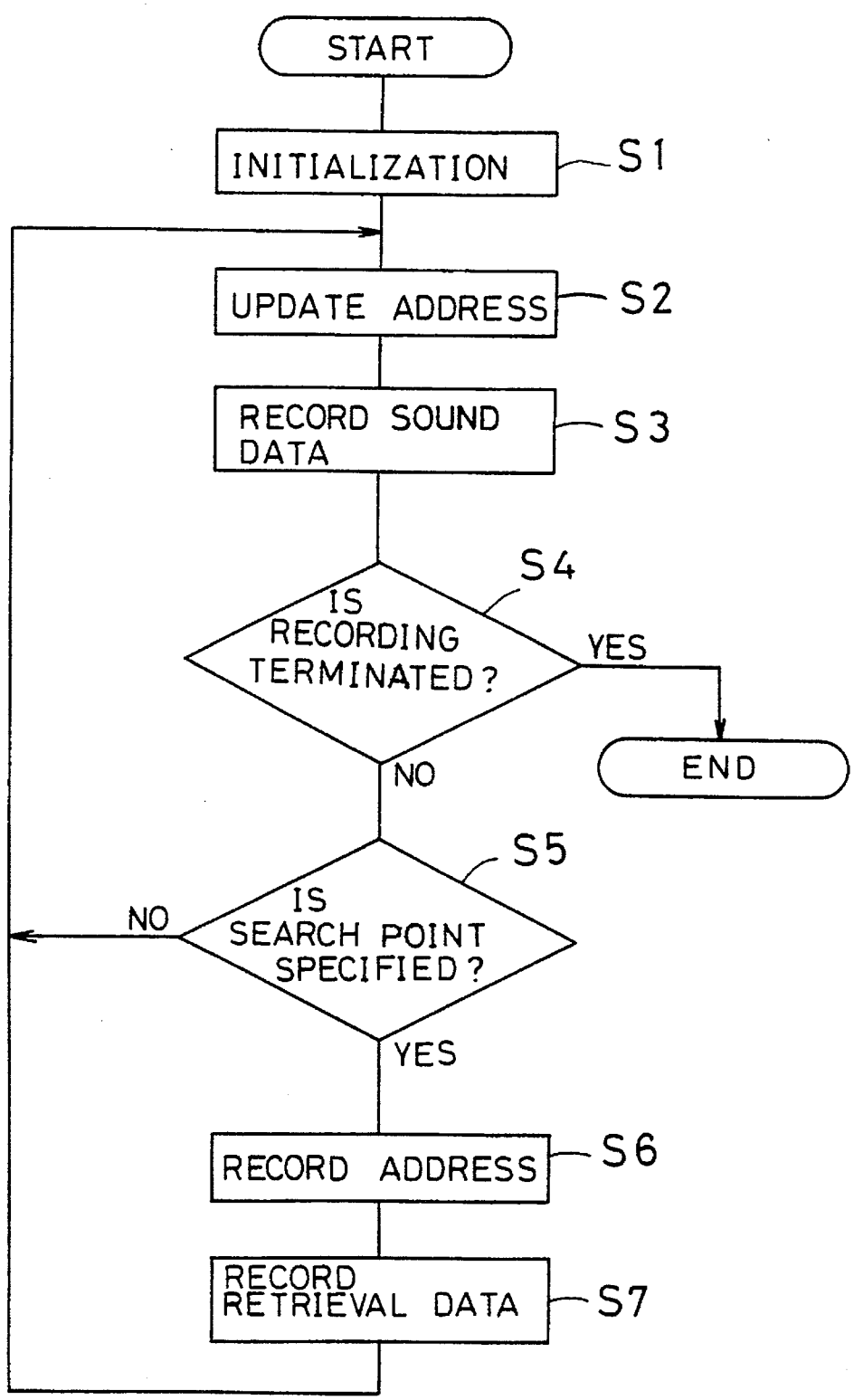
FIG. 5 is a flowchart showing an operation when the recording and reproducing apparatus shown in FIG. 1 records sound.

Operation of the recording and reproducing apparatus of the above structure at the time of recording will be described in reference to the flowchart shown in FIG. 5. In this recording and reproducing apparatus, when a power is on, the application program is loaded into the memory 9 and it is executed by the CPU 8. When the key input for starting is provided, recording it started.

First, initialization including an input of a file name given to sound to be recorded or specification of recording a start position or the like is performed through a key input at step S1. Meanwhile, the input analog sound is converted to digital sound data by the A/D converter 2a and input into the buffer 10 through the interface 13 and the extension bus 18. Then, processing such as data compression is performed therein.

At this time, an address of the IC memory card 7 is updated in order to record the sound data at step S2. Then, the sound data output from the buffer 10 is written and recorded in the IC memory card 7 through the extension bus 18 and the interface 14 at step S3. While recording, it is determined whether the recording is terminated by an input of a stop key or not at step S4. Then, when the recording is terminated, the recording is stopped. If the recording is not terminated, it is determined whether a search point indicating a position where the index is recorded is specified by the key input or not at step S5.

At step S5, when the search point is not specified, the process returns to step S2 and the recording is continued. When the search point is specified, the address of the sound data storage region 7a updated at step S2 is recorded in the index storage region 7b of the IC memory card 7 at step S6. In addition, each kind of the retrieval data given through the key input or the retrieval data set regardless of the key input is provided with the sound sorting code from the frequency analysis circuit 5. That is, the sorting mark is recorded in the index storage region 7b at step S7, and then the process returns to step S2 and the recording is continued.

While recording in the manner described above, since the sound data bytes are taken into the buffer 10 one after another, the recording of the sound data is not interrupted by the recording of the index.

Figure 6:
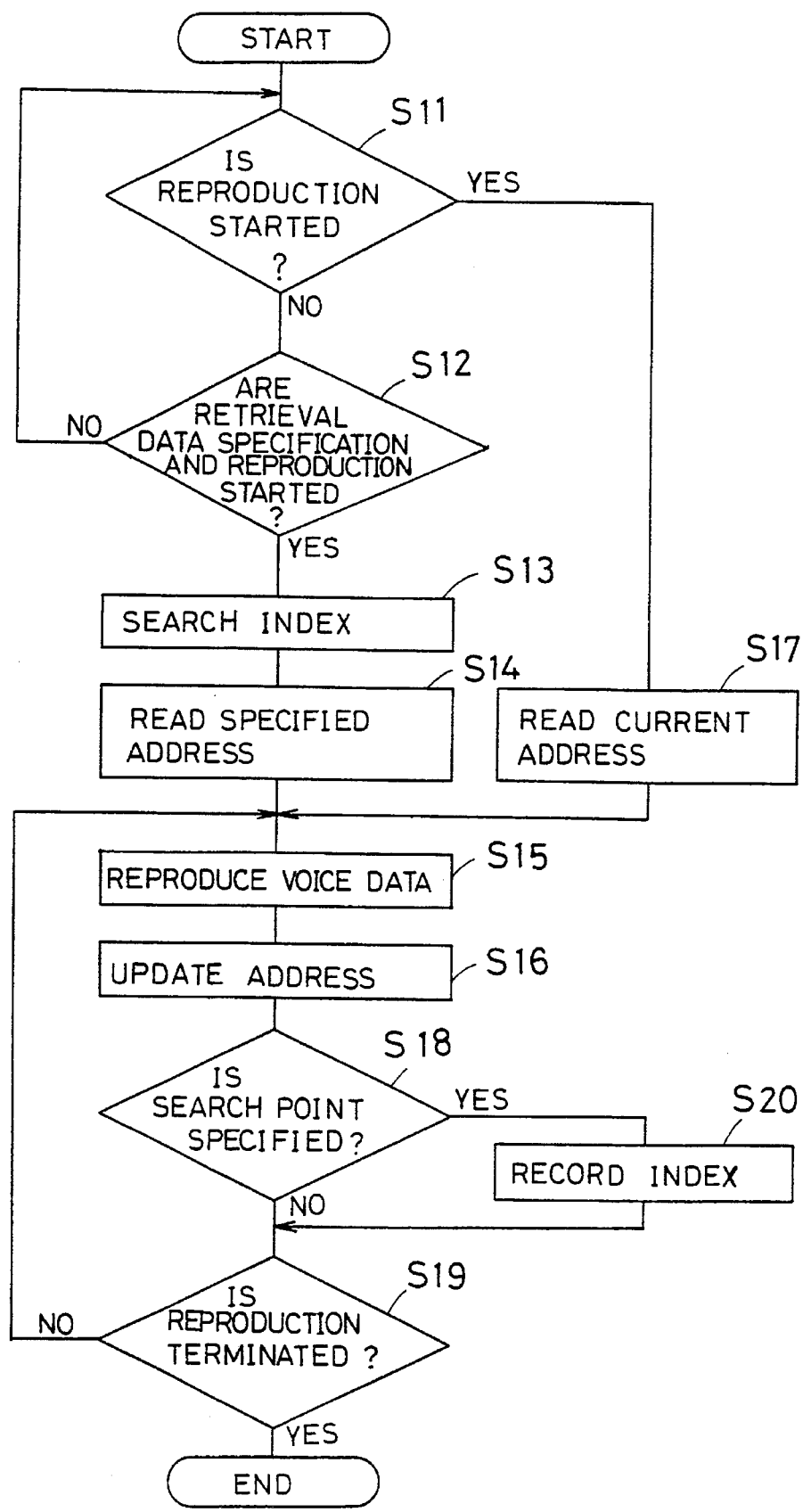
FIG. 6 is a flowchart showing an operation when the recording and reproducing apparatus shown in FIG. 1 reproduces sound.

Then, an operation of reproduction by the recording and reproducing apparatus will be described in reference to a flowchart shown in FIG. 6.

First, it is determined whether reproduction is started by an input of a reproduction key or not at step S11. When reproduction is not started, it is determined whether the retrieval data is specified and reproduction is started or not at step S12. At step S12, when the specification of the retrieval data and starting of reproduction is not performed, the process returns to S11. When the specification of the retrieval data and starting of reproduction is performed, the retrieval data to be retrieved are successively searched from a position of the address pointer $AP_1$ attached to the index recorded in the index storage region 7b on the IC memory card and then the index containing the retrieval data is detected at step S13. Then, an address where the sound data corresponding to the retrieval data are recorded is read at step S14. Then, the sound data are read from the address of the sound data storage region 7a and reproduced at step S15. When the reproduction of the sound data is terminated, the address in the sound data storage region 7a is updated at step S16. In addition, when the reproduction is started at step S11, a current address is read at step S17 and the sound data is reproduced from that address at step S15.

The read sound data are taken into the buffer 10 through the interface 16 and the extension bus 18 and data is returned to an original form. Then, the sound data are converted to an analog sound signal by the D/A converter 3a through the extension bus 18 and the interface 14.

While reproduction is performed as described above, the index can be recorded and it is determined whether the search point is specified by the key input or not at step S18. When the search point is not specified, it is determined whether reproduction is terminated by the input of the stop key at step S19. When the reproduction is terminated, the reproduction is stopped. When the reproduction is not terminated, the process returns to step S15. In addition, when the search point is specified at step S18, the index at the specified position is recorded at step S20.

When the sorting code representing the characteristic the sound data input to the body 1, that is, the sorting mark, is recorded as the retrieval data of the index in the IC memory card, a first index is applied to the address indicating a start of the sound data and a second index is applied to the address indicating an end of the sound data in order to determine a section of the sound data. When the start of the reproduction of the sound data having the category specified by the manual input means is specified, the operation of reproduction shown in the flowchart in FIG. 6 is performed. The index containing the retrieval information which specifies the category is retrieved in the IC memory card and the sound in a section starting from the address indicated by the positional information contained in the first index read by the retrieval and ending at the address positioned next to the first index in the IC memory card and indicated by the positional information of the second index indicating the end of the section of the sound is reproduced.

Figure 7:
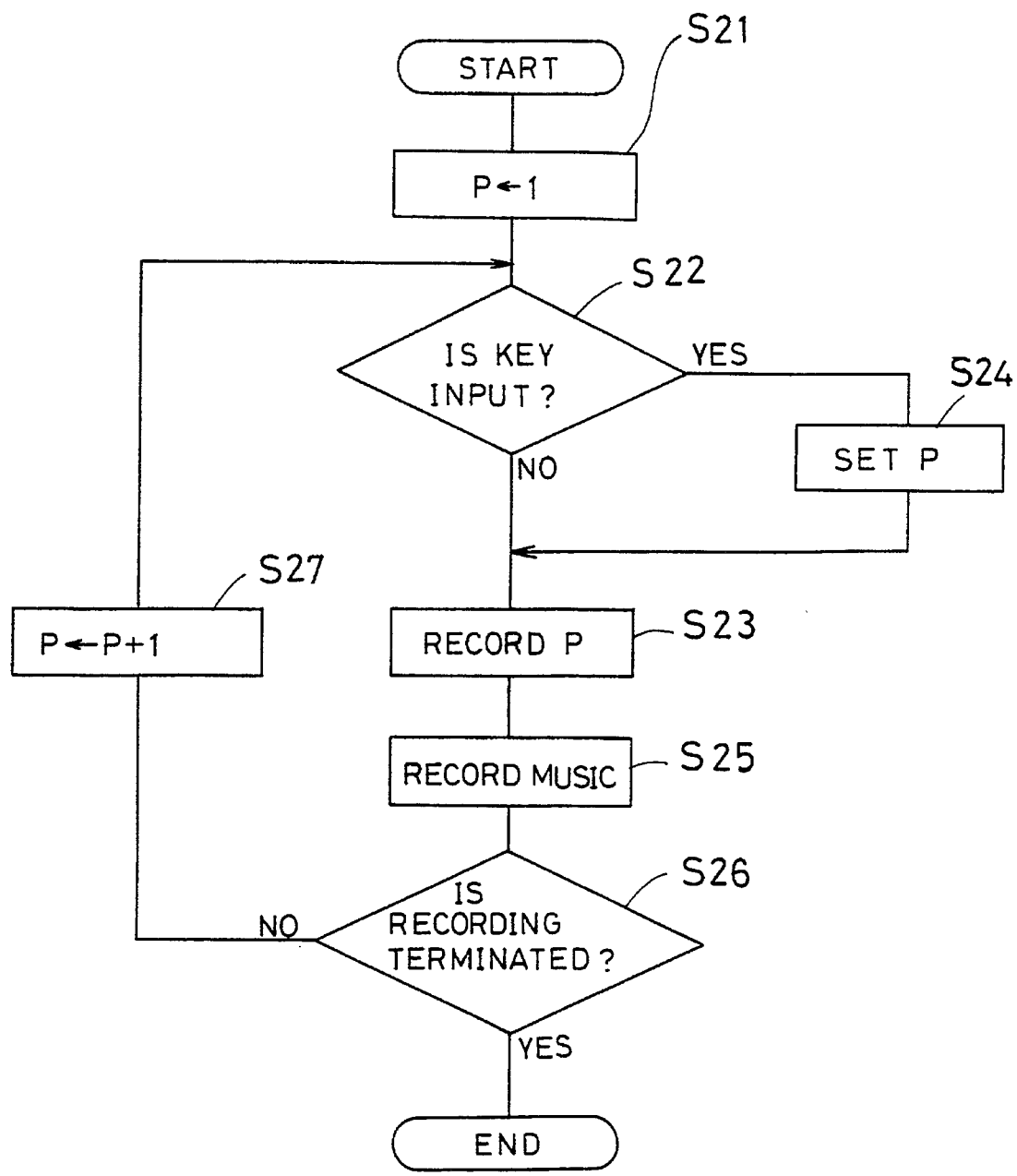
FIG. 7 is a flowchart showing an operation of recording a reproduction order of music while recording sound in the recording and reproducing apparatus shown in FIG. 1.

An operation of giving a reproduction order when plural music selections are recorded will be described in reference to a flowchart shown in FIG. 7.

First, a priority number P for determining a reproduction order is set at 1 at step S21 and it is determined whether the priority number P is set by a key input or not at step S22. When the priority number P is automatically set at step S22, the automatically set priority number P is recorded in the index storage region 7b as a priority mark at step S23. Alternatively, when the priority number P is input by the key input at step S22, the input priority number P is set at step S24 and it is recorded as the priority mark at step S23.

Thereafter, music is recorded at step S25. When a piece of music is completely recorded, it is determined whether the recording is terminated or a next piece of music is recorded or not at step S26. Then, when the recording is terminated, the process ends. When the next piece of music is recorded, 1 is added to the priority number P at step S27 and then process after step S22 is repeated.

Figure 8:
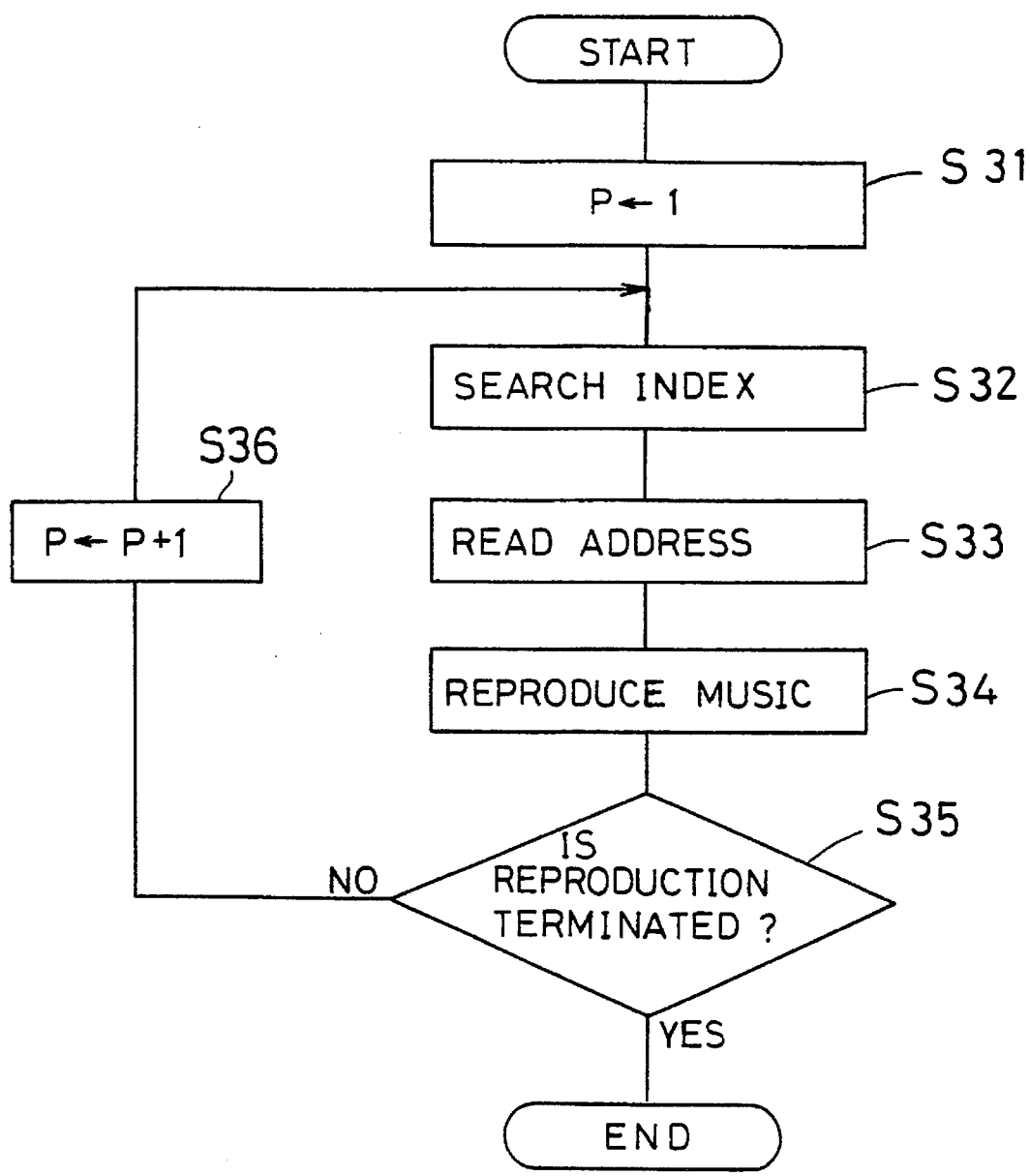
FIG. 8 is a flowchart showing an operation of reproducing music in accordance with the reproduction order in the recording and reproducing apparatus shown in FIG. 1.
Figure 9:
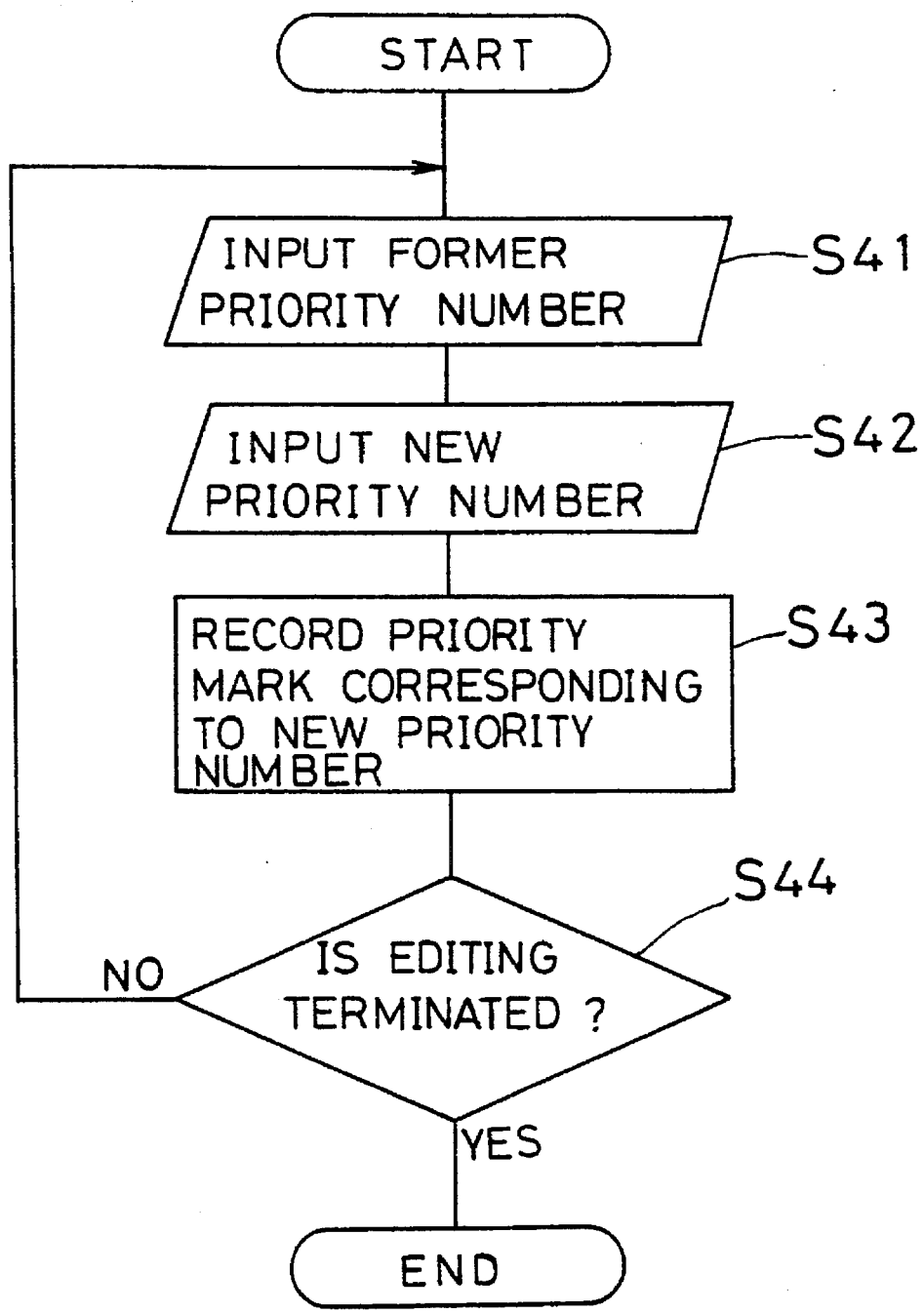
FIG. 9 is a flowchart showing an operation of changing the reproduction order of music while the recording and reproducing apparatus shown in FIG. 1 stops.
Figure 10:
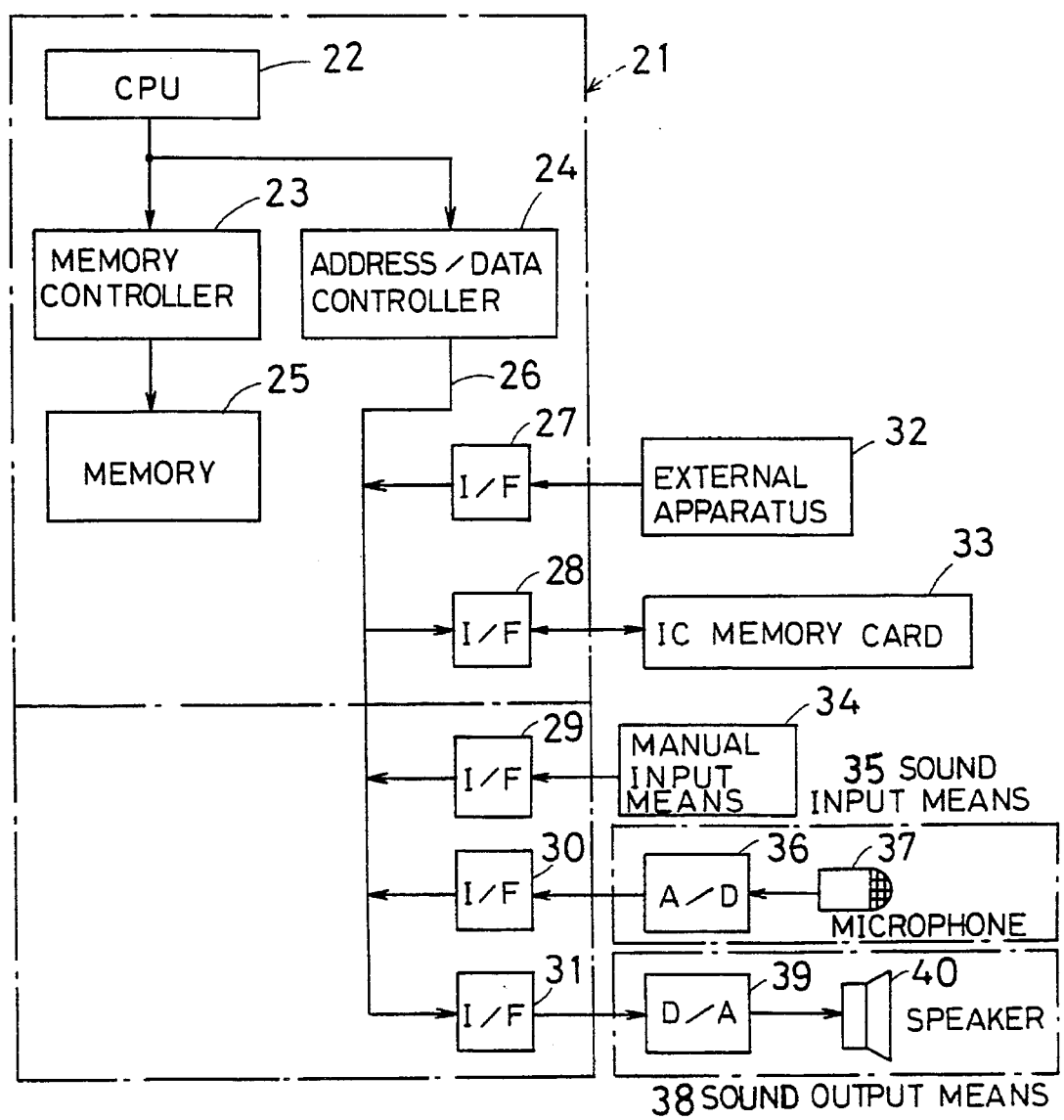
FIG. 10 is a block diagram showing a structure of a conventional recording and reproducing apparatus.
Figure 11:
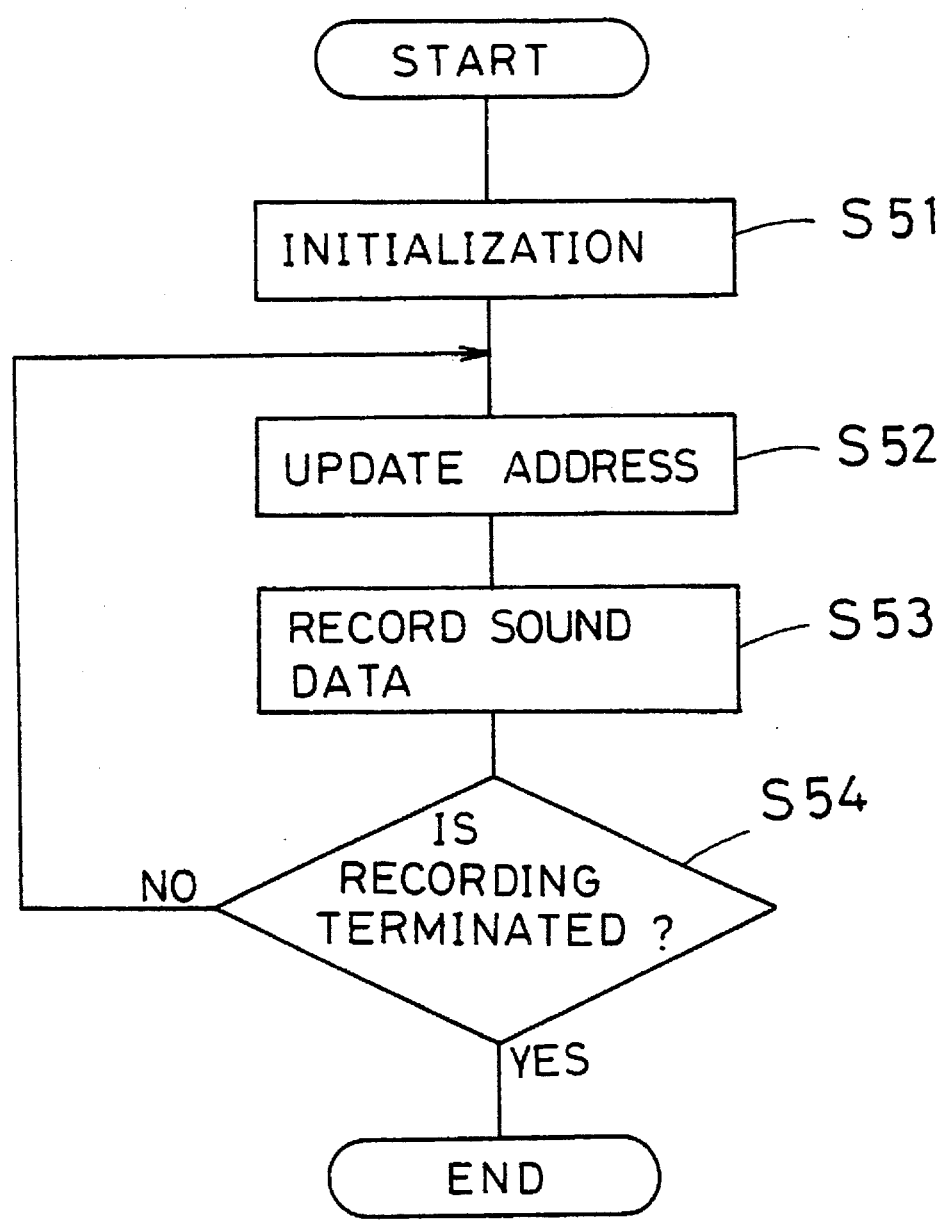
FIG. 11 is a flowchart showing an operation when the recording and reproducing apparatus shown in FIG. 10 records sound.
Figure 12:
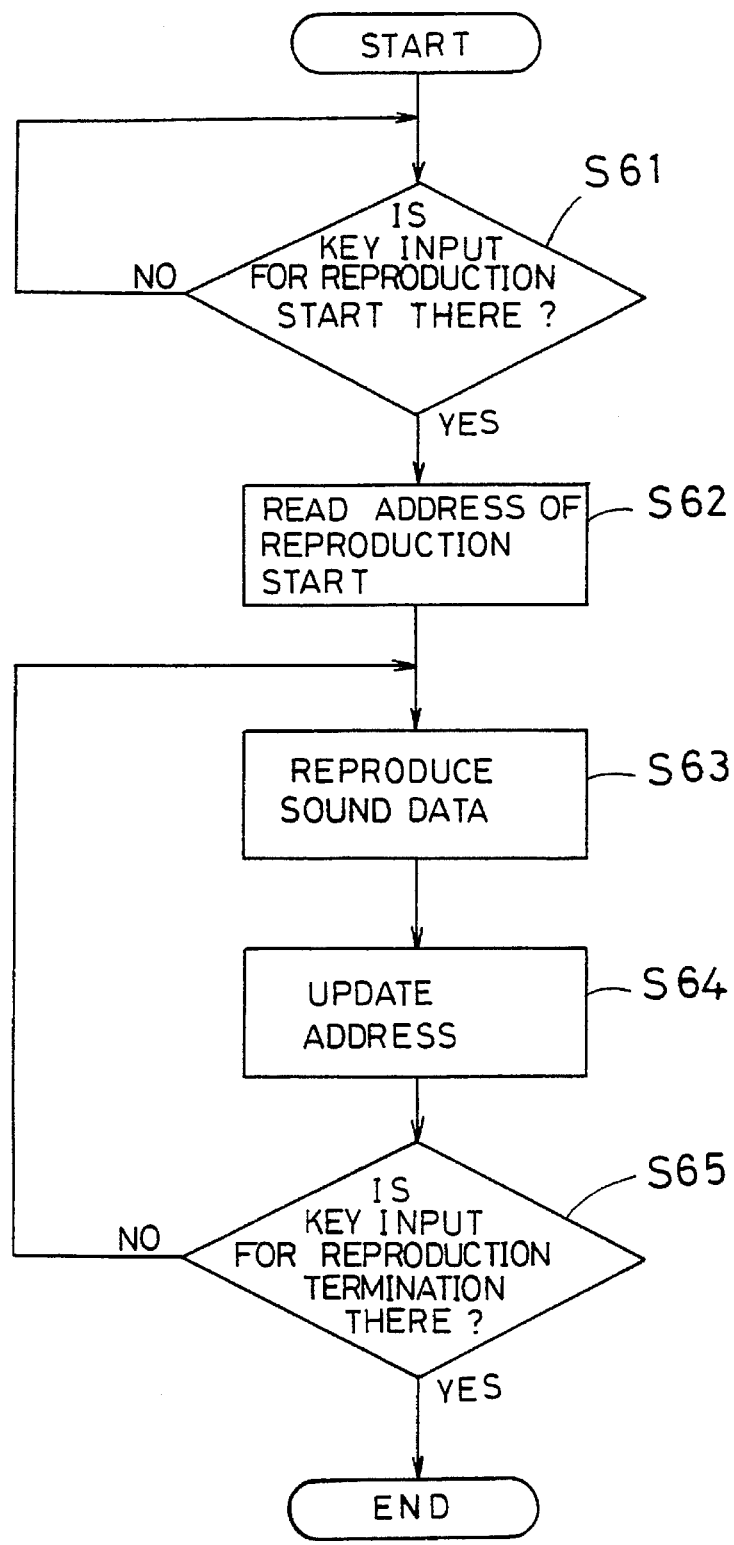
FIG. 12 is a flowchart showing an operation when the recording and reproducing apparatus shown in FIG. 10 reproduces sound.

Then, an operation when music is reproduced in accordance with the reproduction order given during recording will be described in reference to a flowchart shown in FIG. 8.

First, reproduction is started, the priority number P is set at 1 at step S31. The index of the index storage region 7b is searched in accordance with the priority number P at step S32. Thus, an address is read from the index of the priority mark corresponding to the priority number P at step S33. Then, the sound data at the address is read and the music of the specified priority number P is reproduced at step S34.

Then, a piece of music is completely reproduced, it is determined whether the reproduction is terminated or not at S35. When the reproduction is terminated, the process ends. When the next piece of music is reproduced, 1 is added to the priority number P at step S36 and then the process after step S32 is repeated.

According to the recording and reproducing apparatus of the present invention, it is possible to rearrange an order of reproduction of music even while the operation is not performed. The operation at that time will be described in reference to FIG. 9.

First, while replacement of the priority number P is possible by a key input for replacing the priority number P, a former priority number to be replaced is input at step S41. Then, a new priority number to be replaced with the former priority number is input at step S42. Then, the priority mark corresponding to the new priority number is recorded at any one of the address pointers $AP_1$ to $AP_{max}$ where the priority mark corresponding to the former priority number is recorded at step S43. When the former priority number is replaced with the new priority number, it is determined whether editing is terminated or not at step S44. When the editing is terminated, the process ends, while when the editing is continued, the process after step S41 is repeated.

As described above, according to the recording and reproducing apparatus in accordance with this embodiment of the present invention, since the document mark DM, the search mark SM, the sorting mark CM and the priority mark PM are recorded as retrieval data in the index storage region 7b in the IC memory card 7, reproduction is performed in various patterns using the above marks.

For example, the head of music can be found out by the document mark DM, music is reproduced from a desired position where the search mark SM is recorded, or only a sound of a specific speaker is reproduced by sorting the speaker by the sorting mark CM. When the sorting mark CM is used, it is possible to distinguish between music and announce and then reproduce them. In addition, when the priority mark PM is used, music or the like can be reproduced in a desired order and it is possible to rearrange the reproduction order of music without editing such as dubbing.

The recording and reproducing apparatus of the present invention comprises index recording means 8b for recording an index having retrieval information for retrieving an arbitrary position of sound data in a semiconductor memory 7 and positional information indicating a position of the sound data in the semiconductor memory 7 to be retrieved by the retrieval information; and retrieving and reproducing means 8c for retrieving the index containing the retrieval information specified by manual input means 4, reading the sound data in the semiconductor memory 7 from a position indicated by the positional information contained in the index under the control of an address/data controller 12, transferring it into a buffer and reproducing the sound data in the buffer 10 as sound through sound output means 3; and the semiconductor memory 7 separately comprises an index storage region 7b in which the index is recorded and a sound storage region 7a in which the sound data is recorded. Therefore, a reproduction starting position of specified sound is searched by the index, so that time required for reproducing the sound can be reduced.

The recording and reproducing apparatus of the present invention comprises index recording means 8b for recording an index having retrieval information for retrieving an arbitrary position of sound data in a semiconductor memory 7 and positional information indicating a position or address of the sound data in the semiconductor memory 7 to be retrieved by the retrieval information; sound sorting means 17 for extracting a characteristic of the sound data input to the body and generating a sorting code indicating the characteristic of the sound; the category specifying means 8d for specifying a category indicating a characteristic of sound data in a section divided by positional information of the sound data contained in first and second indexes in a semiconductor memory, using a sorting code recorded in retrieval information in the index indicating a head address of the sound data in each section; and the category selecting and reproducing means 8e for retrieving the index containing the retrieval information for specifying the category specified by manual input means in the semiconductor memory and reproducing sound in a section from an address indicated by the positional information contained in the first index read by the retrieval to an address indicated by the positional information of the second index which is indicating the end of the section and is positioned next to the first index in the semiconductor memory; and the semiconductor memory 7 separately comprises an index storage region 7b in which the index is recorded and a sound storage region 7a in which the sound data is recorded. Therefore, only the sound in a section having a specified category is selected and reproduced in a short time.

The recording and reproducing apparatus of the present invention comprises index recording unit 8b for recording an index having retrieval information for retrieving an arbitrary position of sound data in a semiconductor memory 7 and positional information indicating a position or address of the sound data in the semiconductor memory 7 to be retrieved by the retrieval information; the reproduction Order specifying unit 8f for specifying a reproduction order of the sound data in a section divided by the positional information of the sound data contained in first and second indexes in the semiconductor memory, using retrieval information of the index indicating the head address of the sound data in each section; and the priority order reproducing unit 8g for retrieving the retrieval information of the index in the semiconductor memory in accordance with priority and reproducing sound in a section from an address indicated by the positional information of the first index read every retrieval to an address indicated by the positional information of the second index positioned next to the first index and indicating the end of the section of the sound data to be reproduced; and the semiconductor memory 7 separately comprises an index storage region 7b in which the index is recorded and a sound storage region 7a in which the sound data is recorded. Therefore, sound in each section can be rearranged in accordance with the specified reproduction order and reproduced in a short time.

Another embodiment of the present invention will be described in reference to perspective views shown in FIGS. 13 and 14. According to this embodiment of the present invention, retrieval data are recorded at a desired position of the input sound and the desired head or beginning of the sound can be found out by retrieving the retrieval data in a moment. According to this embodiment of the present invention, the body 59 comprises the sound input means 2 having the A/D converter 2a and the microphone 2b, and the sound output means 3 having the D/A converter 3a and the speaker 3b shown in FIG. 1. In addition, the sound sorting means 17 is not provided in the body and the category specifying means 8d, the category selecting and reproducing means 8e, the reproduction order specifying means 8f and the priority order reproducing means 8g are also not provided in the CPU.

Figure 13:
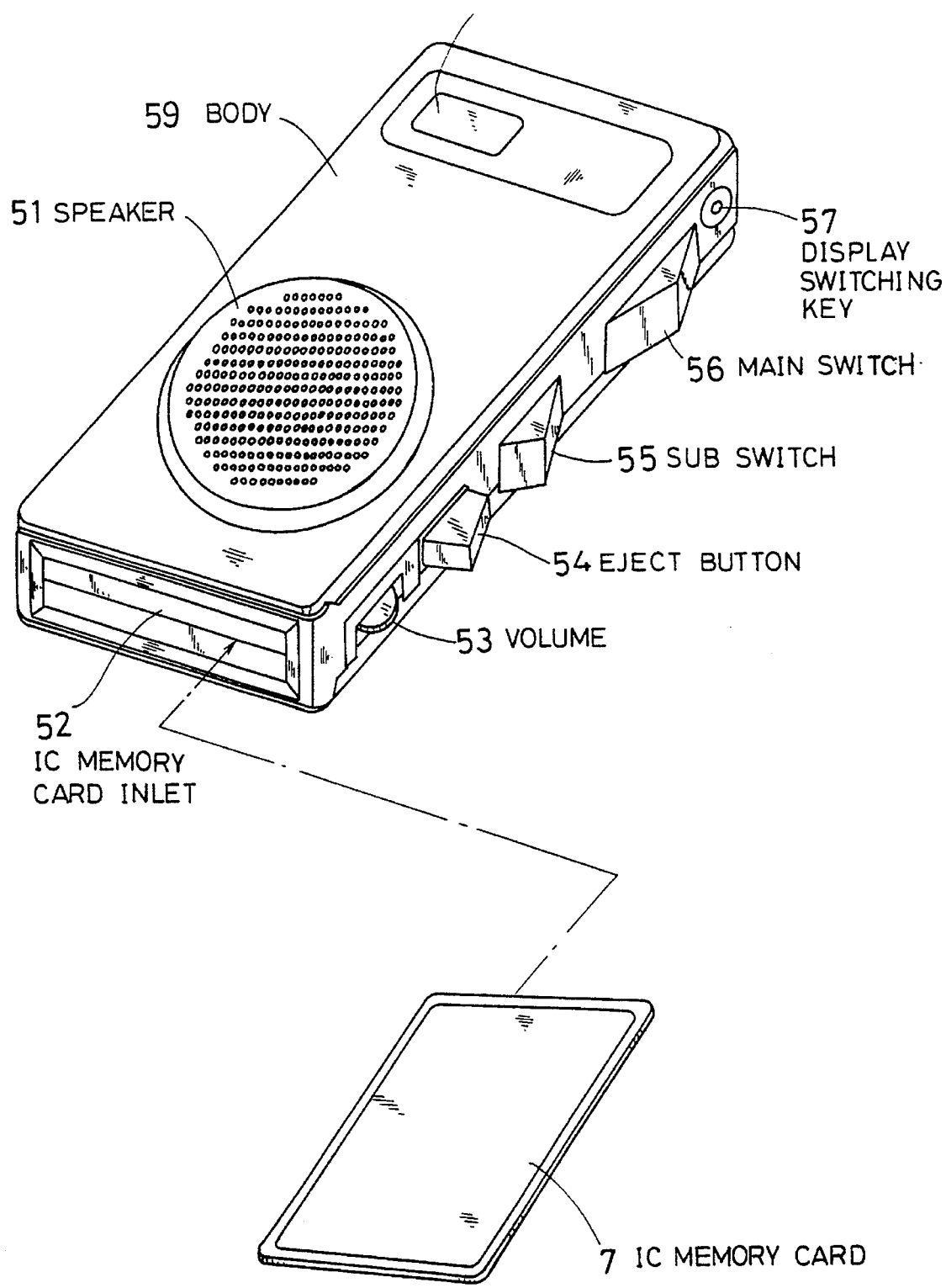
FIG. 13 is a perspective view in accordance with another embodiment of the present invention.

Referring to FIG. 13, a main switch 56 is for recording the sound signal and a sub switch 55 is used for fast forwarding at the time of reproduction and for skipping to the forward retrieval mark. The IC memory card 7 is detachable into or from the body through an IC memory card inlet 52. An eject bottom 54 is used for taking the IC memory card off the body. Volume from a speaker 51 can be adjusted using a volume 53. A display switching key 57 switches the displayed contents, for example, an elapsed time or a mark number.

Figure 14:
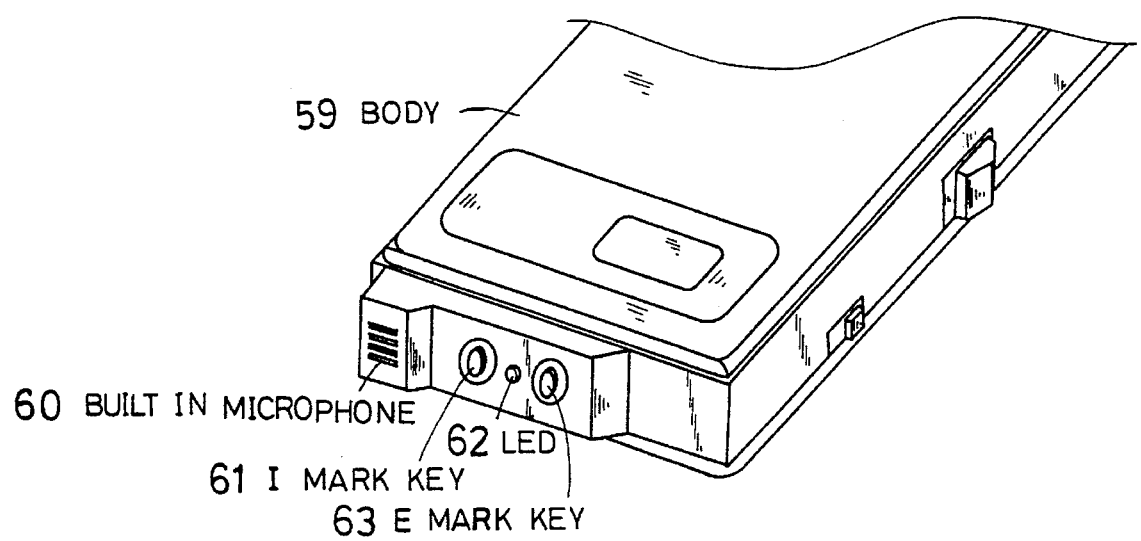
FIG. 14 is a perspective view in accordance with another embodiment of the present invention, which is viewed from a side different from that of FIG. 13.

Referring to FIG. 14, the body 59 comprises a built-in microphone 59 for inputting sound, an I mark key 60 used for recording a position of sound whose head is to be found out at the time of retrieving or reproducing the sound from that point, an LED 61 for displaying conditions of recording and E mark key 62 used for recording an end position of input sound or reproducing sound next to the end position from the end position.

In addition, the eject bottom 54, the sub switch 55, the main switch 5, the display switching key 57, the I mark key 60, the E mark key 62 correspond to the manual input means 4 shown in FIG. 1.

While only certain presently preferred embodiments have been described in detail, as will be apparent with those skilled in the art, certain changes and modifications can be made without departing from the scope of the invention as define by the following claims.

What is claimed is:

1. An apparatus for recording and reproducing sound, comprising:

a random access semiconductor memory for storing recorded sounds;

means for recording sounds and storing the recorded sounds in random access fashion in the semiconductor memory;

means for storing index information in the semiconductor memory, each index including an address of a corresponding portion of recorded sound stored in the semiconductor memory and at least one of a plurality of index codes for marking selected portions of recorded sound;

means for retrieving a selected portion of stored sound from the semiconductor memory in random access fashion based on the index corresponding to the selected portion; and means for reproducing the selected portion of sound retrieved by the means for retrieving.

2. The apparatus of claim 1, further comprising:

means for identifying selected portions of sound using one of the plurality of index codes, wherein the index codes include a document code for marking the beginning and end of a portion of recorded sound and a search code for marking a particular point within that portion of recorded sound.

3. The apparatus of claim 2, wherein the index codes further include a priority code for assigning a priority of reproduction of particular portions of recorded sound specified by a corresponding document code such that the means for retrieving retrieves the particular portions of recorded sound in a sequence dictated by priority codes corresponding to those particular portions.

4. The apparatus of claim 3, further comprising:

means for searching the recorded sound using one of the index codes to retrieve portions of the sound associated with the one index code.

5. The apparatus of claim 2, wherein the index codes further include a sorting code assigned to portions of recorded sound based on the type of sound recorded.

6. The apparatus of claim 5, wherein the sound type of a portion of recorded sound is determined based on a frequency analysis of that portion of recorded sound and those portions of recorded sound having substantially the same frequency analysis are assigned the same sorting code.

7. The apparatus of claim 6, further comprising:

means for sorting different portions of recorded sound using the sorting code such that only those portions of recorded sound having the same sorting code are reproduced.

8. The apparatus of claim 5, further comprising:

means for searching the recorded sound using one of the index codes to retrieve portions of the sound associated with the one index code.

9. The apparatus of claim 1, wherein the sound and the index information are stored in separate areas of the semiconductor memory.

10. The apparatus of claim 1, further comprising:

means for discriminating different types of sounds based on a frequency analysis of the sounds where different types of sounds have different frequency analyses, and means for associating a corresponding sorting code with each different type of sound, wherein the means for retrieving retrieves portions of recorded sound of one type using its corresponding sorting code.

11. A recording and reproducing apparatus comprising:

means for recording sound;

a semiconductor memory having a first section for storing recorded sound and a second section for storing index information for identifying portions of recorded sound;

means for extracting characteristics of the portions of recorded sound;

means for storing a sorting code in the semiconductor memory as part of the index information based on the extracted characteristics for portions of recorded sound;

means for retrieving from the semiconductor memory and reproducing portions of the recorded sound using corresponding index information.

12. The apparatus according to claim 11, wherein the means for extracting includes a frequency analyzer for analyzing the frequency content of portions of sound during recording and wherein two portions of sound having substantially the same frequency content are assigned the same sorting code.

13. The apparatus according to claim 11, wherein portions of sound of the same type are selectively retrieved and sequentially reproduced using a corresponding sorting code.

* * * * *